United States Patent [19]

Hirano

[11] Patent Number: 5,801,992
[45] Date of Patent: Sep. 1, 1998

[54] HIGH SPEED LOW-POWER CONSUMPTION SEMICONDUCTOR NON-VOLATILE MEMORY DEVICE

[75] Inventor: Masanori Hirano, Kanagawa, Japan

[73] Assignee: NEC Corporation, Japan

[21] Appl. No.: 901,811

[22] Filed: Jul. 28, 1997

[30] Foreign Application Priority Data

Jul. 30, 1996 [JP] Japan ............................ 8-200642

[51] Int. Cl.$^6$ .......................................... G11C 7/00
[52] U.S. Cl. .......................... 365/185.25; 365/185.21; 365/203; 365/207
[58] Field of Search .................................. 365/203, 207, 365/185.25, 185.21

[56] References Cited

U.S. PATENT DOCUMENTS 5,625,586  4/1997  Yamasaki et al. ............ 365/185.25 X
5,703,820  12/1997 Kohno ........................... 365/185.25 X

FOREIGN PATENT DOCUMENTS 62-175997  8/1987  Japan .

*Primary Examiner*—Do Hyun Yoo
*Attorney, Agent, or Firm*—Hayes, Soloway, Hennessey, Grossman & Hage, P.C.

[57] ABSTRACT

A current source of a semiconductor read only memory device supplies current through a digit line to a memory cell so as to seen be whether the memory cell is implemented by an enhancement type transistor or a depletion type transistor, and a potential transferring circuit either discharges a precharge level from an input line connected to a sense amplifier or maintains the precharge level depending upon the potential level at the drain node of the memory cell so that a small amount of parasitic capacitance of the input line allows the sense amplifier to rapidly determine the operation mode of the memory cell.

10 Claims, 7 Drawing Sheets

HIGH SPEED LOW-POWER CONSUMPTION SEMICONDUCTOR NON-VOLATILE MEMORY DEVICE

BACKGROUND OF THE INVENTION

1. Field of the Invention

This invention relates to a semiconductor non-volatile memory, device and, more particularly, to a high-speed low-power consumption semiconductor non-volatile memory device.

2. Description of the Related Art

A semiconductor read only memory device stores a data bit in the form of threshold of a memory transistor, and the data bit is read out by supplying electric current from a digit line to the memory transistor. If the memory, transistor has a low threshold, a read-out potential on the associated word line causes the memory transistor to turn on, and the electric current passes through the memory transistor. As a result, the potential level on the digit line drops. On the other hand, if the memory transistor has a high threshold, the read-out potential on the word line causes the memory transistor to remain off, and the electric current does not pass through the memory transistor. The memory transistor maintains the potential level on the digit line. Thus, the logic level of the stored data bit is converted to the potential level on the digit line depending on the threshold of the memory transistor.

FIG. 1 illustrates a typical example of a semiconductor read only memory device. Eight memory transistors, each represented by a small circle, are connected in series, and form a memory block. High threshold and low threshold are selectively assigned to the memory transistors, and the memory transistor with the low threshold and the memory transistor with the high threshold are operative in the depletion mode and the enhancement mode, respectively. A memory transistor with the low threshold is represented by a vertical line in the small circle, and the vertical bar is removed from the small circle to represent a memory transistor with the high threshold.

The eight memory transistors of each memory cell block are respectively gated by word lines W0, W1, W2, W3, W4, W5, W6 and W7, and the word lines W0 to W7 are selectively changed to a read-out level between the low threshold and the high threshold.

A plurality of memory cell blocks MCC11, MCC12, MCC1m, MCC1n, . . . , MCCm1, MCCm2, MCCmm and MCCmn are arranged in rows and columns, and a digit line DL0/DL1/DL2/ . . . /DLj is associated with every two columns of memory, cell blocks or a memory cell section 10x, 11x, 12x, . . . and 1ix. Every two adjacent memory cell blocks in each row forms a memory cell block pair, and, accordingly, one of the digit lines DL0 to DLj relates to the memory cell block pairs of the associated memory cell section 10x, 11x, 12x, . . . or 1ix. The memory cell blocks MCC11 and MCC12 form one of the memory cell block pairs, for example.

A plurality of block selectors BSC01/BSC02, . . . and BSCj1/BSCj2 are respectively connected to the memory cell block pairs MCC11/MCC12, MCCm1/MCCm2, . . . MCC1m/MCC1n, MCCmm/MCCmn, and the digit lines DL0 to DLj are connected to the block selectors for the associated memory cell sections 10x to 1ix. For example, the digit line DL0 is connected at one end thereof to the block selector BSC01 and at the other end thereof to the block selector BSCO2, and is connectable to the memory cell blocks MCC11, MCC12, MCCm1 and MCCm2. The memory cell block pairs MCC11/MCC12/MCCm1/MCCm2,. . ., MCC1m/MCC1n, MCCmm MCCmn are connected at the other ends to a ground line GND.

Each of the block selectors BSC01 to BSCj2 is implemented by four switching transistors, each represented by a small circle. An enhancement type switching transistor is represented by a vertical bar in the small circle, and a depletion type switching transistor is represented by the small circle without the vertical bar. The switching transistors are gated by block selecting lines BS0, BS1, BS2 and BS3, and the block selecting lines BS0 to BS3 cause the block selector BSC01 to BSCj2 to selectively connect the memory cell blocks MCC11 to MCCmn to the associated digit lines DL0 to DLj. For example, the block selecting lines BS0, BS1, BS2, BS3 allow one of the memory cell blocks MCC11, MCC12, MCCm1 and MCCm2 to connect the associated memory cell blocks MCC11, MCC12, MCCm1, MCCm2 to the digit line DL0.

A column selector 20 is connected between a sense amplifier 30 and the digit lines DL0 to DLj, and is implemented by a parallel combination of switching transistors T20, T21, T22, . . . and T2j. The switching transistors T20 to T2j are gated by column selecting lines Y0, Y1, Y2, . . . and Yj, respectively, and one of the column selecting lines Y0 to Yj is changed to an active level so as to connect the associated digit line DL0 to DLj to the sense amplifier 30.

A plurality of discharging transistors T40, T41, T42, . . . and T4j are connected between the digit lines DL0, DL1, DL2, . . . and DLj and the ground line GND, and are gated by a discharge control line DC. The discharging transistors T40 to T4j turn on upon completion of data access to any one of the memory transistors, and the digit lines DL0 to DLj are discharged to the ground line GND.

FIG. 2 illustrates how access to one of the memory transistors is accomplished. Upon completion of a previous access, the discharge control line DC was changed to an active high level, and the digit lines DL0 to DL3 have been discharged through the discharging transistors T40 to T4j.

External address signals are assumed to arrive at the prior art semiconductor read only memory device at time t1. The external address signals are decoded, and one of the selecting lines Y0 to Yj and one of the block selecting lines BS0 to BS3 are changed to an active high level, and one of the word lines W0 to W7 decays to an active low level. The selected one of the switching transistors T20 to T21 turns on, and the associated one of the digit lines DL0 to DLj is connected through the column selector 20 to the sense amplifier 30.

The digit line DL0 is assumed to be selected. As to the selected digit line DL0, one of the block selecting lines BS0 to BS3 is changed to the active high level, and causes either block selectors BSO01 or BSO02 to connect the digit line DL0 to one of the memory cell blocks MMC11/MMC12/MMCm1/MMCm2. The block selecting line BS0 is assumed to be changed to the active high level, and the block selecting line BS0 causes the block selector BSC01 to connect tie digit line DL0 to tie memory cell block MMC11. Thus, the sense amplifier 30 is electrically connected to the memory cell block MMC11, and supplies electric current to the memory cell block MMC11 through the switching transistor T20 and the block selector BSC01.

One of the word lines W0 to W7 is changed to the active low level or the read-out potential level, and the other word lines are maintained at the inactive high level. If the word line W1 is changed to the read-out potential level, the word line W1 is connected to the enhancement type memory transistor of the memory cell block MMC11, and a conductive channel is not generated in the enhancement type memory transistor. For this reason, the electric current does not pass the enhancement type memory transistor, and the digit line DL0 is maintained at a high level as indicated by plots PL1. Then, the sense amplifier 30 determines that the accessed memory transistor is enhancement type, and produces an output data signal representative of the enhancement type.

If the word line W3 is changed to the active low level, the word line W3 is connected to the depletion type memory transistor, and the conductive channel allows the electric current to pass through the depletion type memory transistor. As a result, the potential level on the digit line DL0 decays as indicated by plots PL2, and the sense amplifier produces the output data signal Dout representative of the depletion type.

After the sense amplifier 30 determines the operation mode of the accessed memory transistor, the selecting line, the block selecting line and the word line are changed to the inactive levels at time t3, and the discharge control signal DC is changed to the active level at time t4. The discharge transistors T40 to T4j turn on, and all the digit lines DL0 to DLj decay to the ground level. The discharge control signal DC is changed to the inactive level at time t5.

However, this prior art semiconductor read only memory device exhibits problem in access time. The electric current firstly charges the parasitic capacitance coupled to the selected digit line, and increases the potential level on the selected digit line. This means that the sense amplifier 30 cannot determine the operation mode of the accessed memory tranisistor until the parasitic capacitor is charged up, i.e., between time t1 and time t2. Even if the sense amplifier 30 has a large current driving capability, the time tx is hardly decreased, because the potential level on the selected digit line is unstable due to the over-charge. If the digit lines DL0 to DLj are precharged before the selection of a digit line, time tx may be decreased. However, it is necessary to charge all the digit lines, and the precharging increases the electric power consumption of this prior art semiconductor read only memory device.

SUMMARY OF THE INVENTION

It is therefore an important object of the present invention to provide a non-volatile semiconductor memory device from which a data bit is read out at high speed without sacrifice of electric power consumption.

To accomplish this object, the present invention proposes to determine the logic level of an accessed data bit on the basis of a potential level at a common node opposite to a current source.

In accordance with one aspect of the present invention, there is provided a semiconductor non-volatile memory device comprising: a plurality of memory cells having respective first nodes connectable to a common node, and respectively storing data bits; a plurality of digit lines selectively connectable to second nodes of the plurality of memory cells; a plurality of word lines selectively connected to the plurality of memory cells, and selectively changed to an active level so as to select one of the plurality of memory cells; a current source for supplying current to the second node of the aforesaid one of the plurality of memory cells; a sense amplifier checking a potential level at the common node to determine whether or not the aforesaid one of the plurality of memory cells provides a current path to the common node for determining the logic level of one of the data bits stored therein; a selector connected between the plurality of memory cells, the plurality of digit lines and the current source so as to connect the current source to the aforesaid one of the plurality of memory cells; and a potential transferring circuit connected between the common node and the sense amplifier, and transferring the potential level from the common node to the sense amplifier.

BRIEF DESCRIPTION OF THE DRAWINGS

The features and advantages of the semiconductor read only memory device of the present invention will be more clearly understood from the following description taken in conjunction with the accompanying drawings in which.

DESCRIPTION OF THE PREFERRED EMBODIMENTS

First Embodiment

Figure 1:
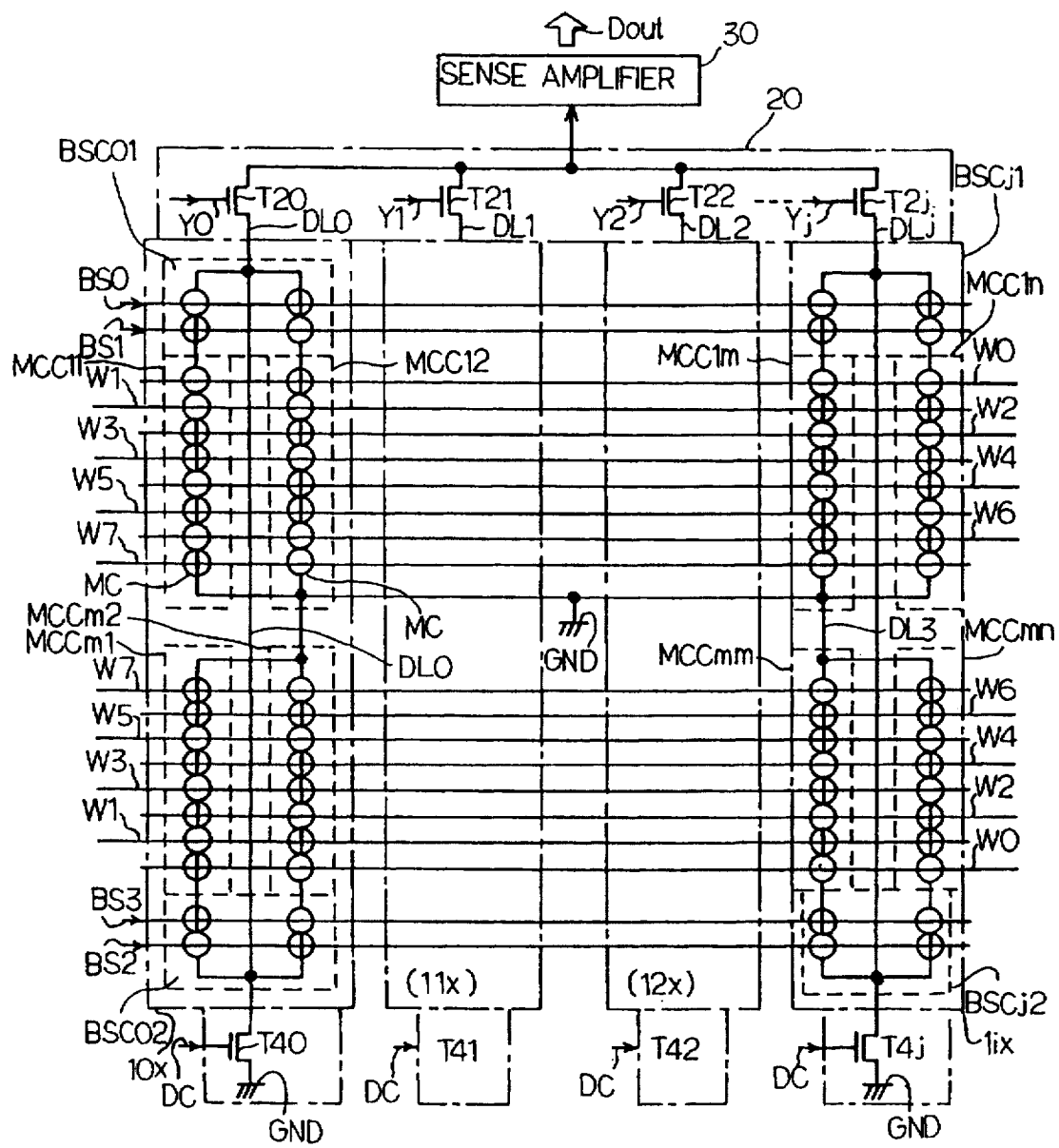
FIG. 1 is a circuit diagram showing the arrangement of a prior art semiconductor read only memory device.
Figure 2:
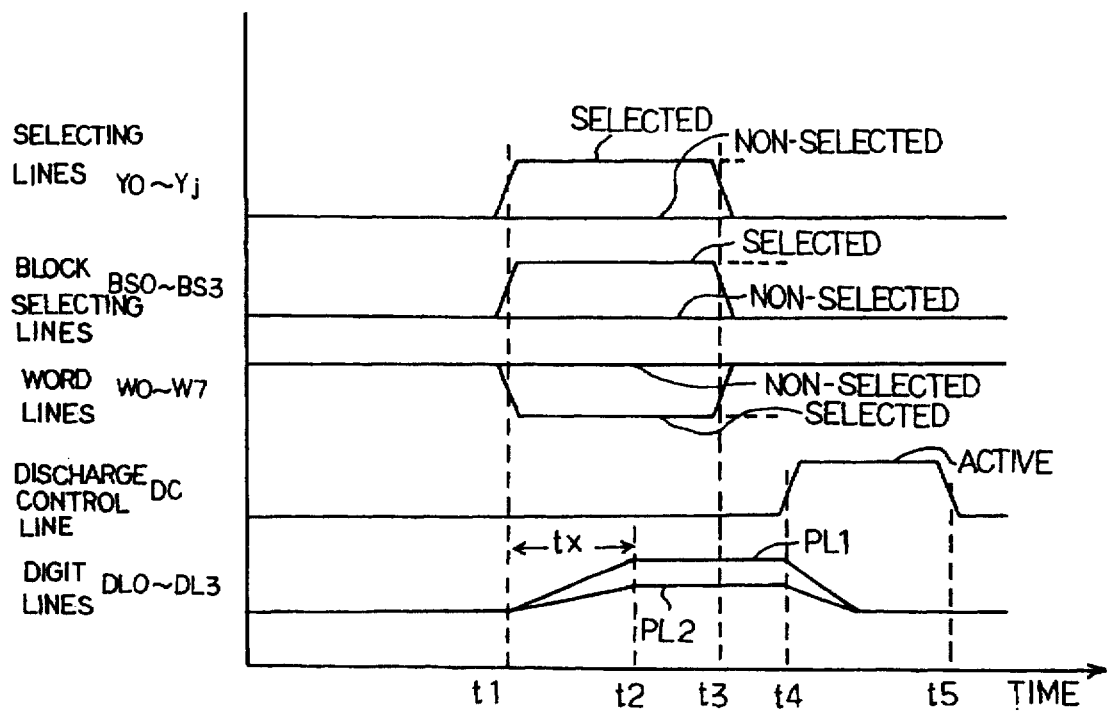
FIG. 2 is a diagram showing the potential levels on the essential control signal lines in the prior art semiconductor read only memory device FIG. 1.
Figure 3:
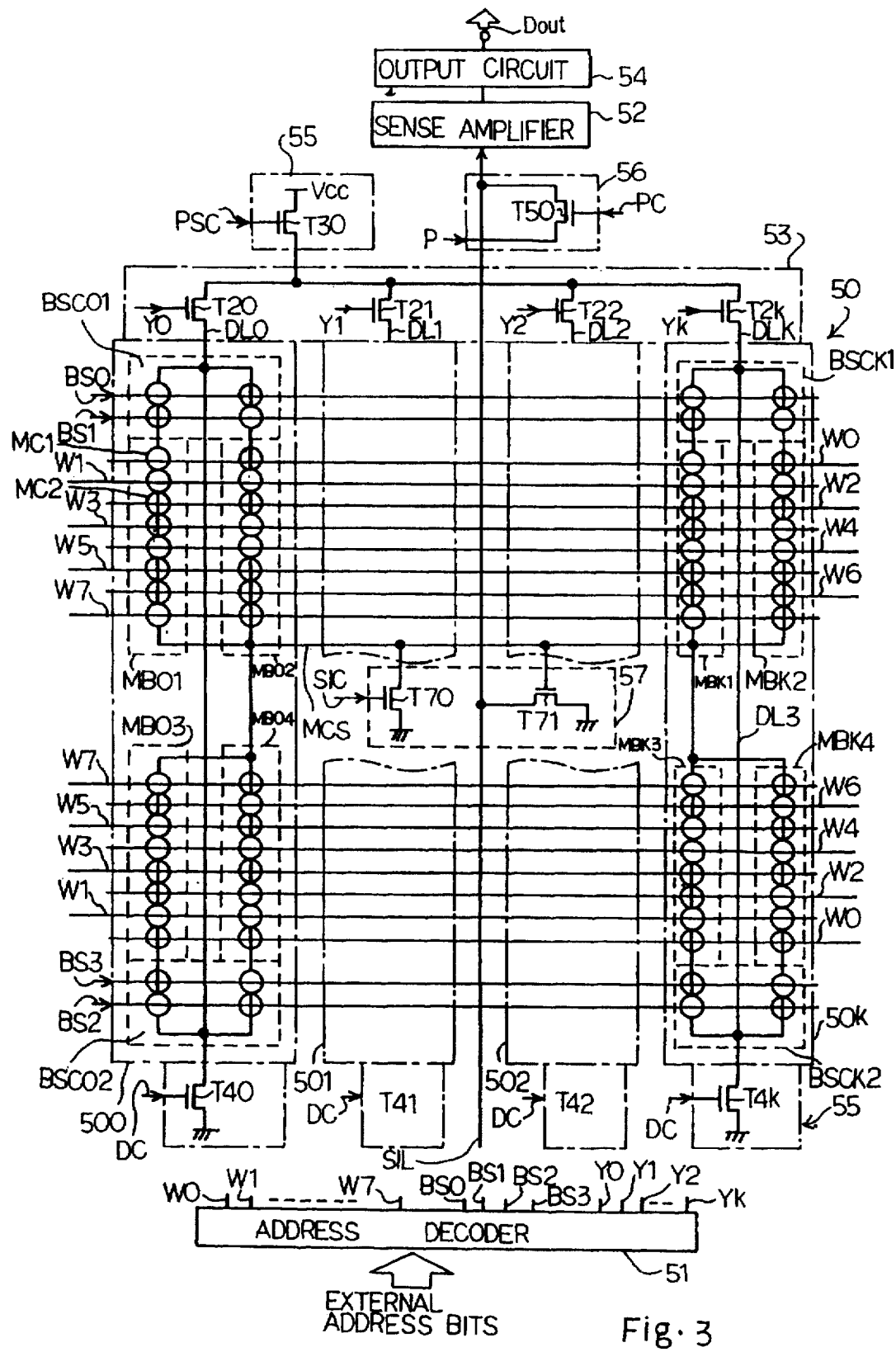
FIG. 3 is a circuit diagram showing the arrangement of a semiconductor read only memory, device according to the present invention.

Referring to FIG. 3 of the drawings, a semiconductor read only memory device of the first embodiment of the present invention comprises a memory cell array 50 divided into a plurality of memory sections 500, 501, 502, . . . and 50k, and the plurality of memory sections 500 to 50k are arranged in parallel to one another.

In this instance, each of the memory sections 500 to 50k includes four memory cell blocks MB01/MB02/MB03/MB04, . . . or MBk1/MBk2/MBk3/MBk4, and each memory cell block MB01 to MBk4 is implemented by eight memory transistors connected in series. A small circle stands for each of the memory transistors, and is operative in either enhancement or depletion mode. An enhancement type memory transistor is represented by a small circle MC1 without a vertical bar, and a vertical bar in a small circle MC2 represents a depletion type memory transistor.

The eight memory transistors of each memory cell block are gated by word lines W0 to W 7, respectively, and the word lines W0 to W7 are maintained in inactive high level before access to any memory transistor. While the word lines W0 to W7 are in the inactive high level, the associated enhancement type memory transistors turn on, and the depletion type memory transistors remain in on-state. For this reason, a current path is provided through the memory cell blocks MB01 to MBk4.

Row addresses are respectively assigned to the word lines W0 to W7, and the word lines W0 to W7 are connected to an address decoder 51. Although the word lines W0 to W7 are maintained in inactive high level before access to a memory transistor, the address decoder 51 changes one of the word lines W0 to W7 to active low level on the basis of external address bits representative of one of the row addresses. If the selected word line is connected to the enhancement type memory transistor, the enhancement type memory transistor turns off, and cuts off the current path. On the other hand, if the selected word line is connected to the depletion type memory transistor, the depletion type memory remains in on-state, and the memory cell block MB01 to MBk4 allows current to flow along the current path.

The semiconductor read only memory device further comprises a plurality of pairs of block selectors BSC01/BSC02, ... And BSCk1/BSCk2 respectively associated with the memory sections 500 to 50k and a plurality of digit lines DlL0 DL 1, DL2, ... DLk also respectively associated with the plurality of memory sections 500 to 50k. The four memory cell blocks of each memory section 500, ... or 50k form two pairs MB01/MB02, MB03/MB04 ..., or MBk1/MBk2 MBk3/MBk4, and the block selectors of each pair BSC01/BSC02, ... , or BSCk1/BSCk2 are connected between the two pairs of memory cell blocks MB01/MB02, MB03/MB04 ..., or MBk1/MBk2, MBk3/MBk4 and the associated digit line DL0, DL1, DL2, ... or DLk. Block addresses are respectively assigned to the four memory cell blocks MB01–MB04, ... or MBk1–MBk4 of each memory section, and block selecting lines BS0 to BS3 selects one of the four memory cell blocks on the basis of external address bits representative of the block address.

Each of the block selectors BSC01/BSC02, ... BSCk1/BSCk2 is implemented by an array of enhancement/depletion type switching transistors also represented by the small circles, and the enhancement/depletion type switching transistors are gated by the block selecting lines BS0, BS1, BS2 and BS3. The block selecting lines BS0 to BS3 are connected to the address decoder 51, and the address decoder 51 maintains all of the block selecting lines BS10 to BS3 in inactive low level before access to a memory transistor. When external address bits specify one of the four memory cell blocks, and drives the associated block selecting lines BS1–BS3 to active high level. Then, the selected memory cell block is connected through the associated block selector to the bit line.

The semiconductor read only memory device further comprises a sense amplifier 52 for determining operation mode of the memory transistor, section selector 53 connected between the digit lines DL0 to DLk and the sense amplifier 52, output circuit 54 for producing an output data signal Dout, current supply circuit 55, input line SIL connected to the sense amplifier 52 and a plurality of selector selecting lines Y0, Y1, Y2, ... Yk. The sense amplifier 52 is potential detecting or current detecting. The section selector 53 is implemented by a parallel combination of switching transistors T20, T21, T22, ... and T2k, and the switching transistors T20 to T2k are gated by the section selecting lines Y0 to Yk, respectively. The switching transistors T20 to T2k are connected between the digit lines DL0 to DLk and the sense amplifier 52, and section addresses are respectively assigned to the digit lines DL0 to DLk and, accordingly, the memory sections 500 to 50k. The section selecting lines Y0m to Yk are connected to the address decoder, and the address decoder 51 changes one of the section selecting lines Y0 to Yk to active high level on the basis of external address bits representative of the section address. Then, the active high level on the section selecting line causes the associated switching transistor T20-T2k to turn on, and the associated digit line DL0-DLk is connected through the switching transistor T20-T2k to the current supply circuit 55. The current supply circuit 55 is electrically connected to the selected digit line DL0-DLk, which in tern is connected through one of the block selectors BSC01-BSCk1 or BSC02-BSCk2 to the selected memory cell block. The current supply circuit 55 is implemented by a charging transistor T30, and the charging transistor T30 is gated by a charge control line PSC so as to supply electric current to the selected memory cell block.

The semiconductor read only memory device further comprises a discharging circuit 55 for discharging the digit lines DL0 to DLk upon completion of access to a memory transistor. The discharging circuit 55 includes a plurality of discharging transistors T40, T41, T42, ... and T4k, and the discharging transistors T40 to T4k are gated by a discharge control line DC. After the sense amplifier 52 determines the operation mode of the accessed memory transistor, a controller (not shown) changes the discharge control line to active high level, and all the digit lines DL0 to DLk are grounded through the discharging transistors T40 to T4k.

The semiconductor read only memory device further comprises an interconnecting line MCS connected to all of the memory cell blocks MB01 to MBk4, a precharge circuit 56 connected between a precharging line P and the input line SIL and a transfer circuit 57 for transferring the potential level on the interconnecting line MCS to the input line SIL. The precharge circuit 56 is implemented by a charging transistor T50. The charging transistor T50 is gated by a precharge control line PC, and the precharging line P charges the input line SIL through the charging transistor T50 when the precharge control line PC is changed to active high level. The precharging line P supplies a potential level Pch to the input line SIL, and the precharging level Pch is close to a threshold of the sense amplifier 52 for determining the operation node of the accessed memory transistor.

The transfer circuit 57 includes a discharging transistor T70 connected between the interconnecting line MCS and a ground line and a transferring transistor T71 connected between the input line SIL and the ground line. The discharging transistor T70 is gated by a discharge control line SIC, and connects the interconnecting line MCS to the ground line. On the other hand, the transferring transistor T71 is gated by the interconnecting line MCS. The transferring transistor T71 turns on or off depending upon the potential level on the interconnecting line MCS, and the input line SIL is either isolated from or connected to the ground line. Though not shown in FIG. 3, the controller changes the potential levels of the precharge control line PC, the precharging line P, and the charge control line PSC and the discharge control line SIC at appropriate timings.

In this instance, the current supply circuit 55 serves as a current source, and the section selector 53 and the block selectors BSC01/BSC02, ... and BSCk1/BSCk2 as a whole constitute a selector. The input line SIL, the precharge circuit 56 and the transfer circuit 57 form, in combination, a potential transfer circuit.

Figure 4:
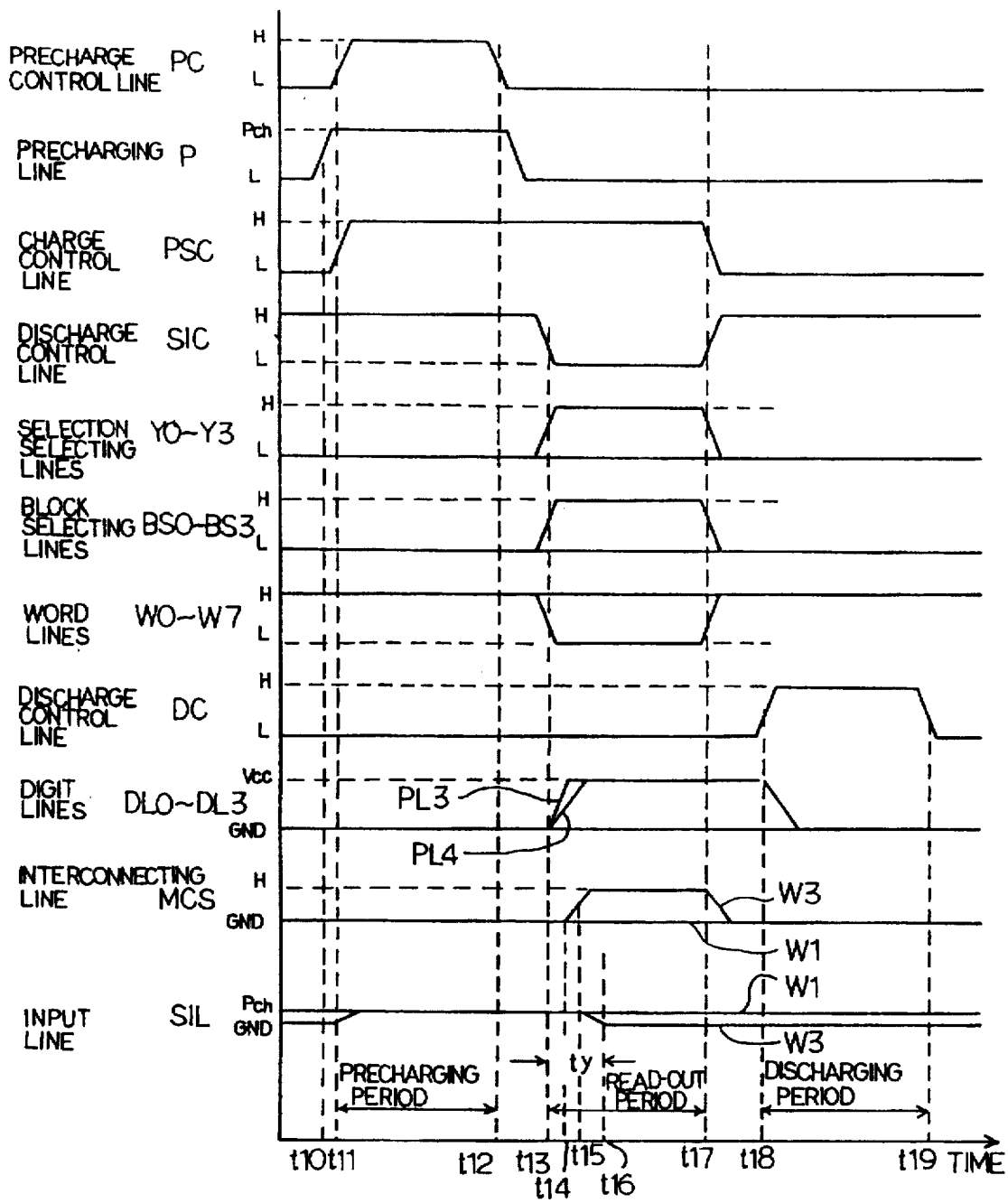
FIG. 4 is a diagram showing the potential levels on essential control lines in the semiconductor read only memory device of FIG. 3.

The semiconductor read only memory device behaves as follows. In the following description, the external address bits are assumed to represent the section address assigned to the memory section 500, the block address assigned to the memory cell block MB01 and the row address assigned to the word line W1 or W3. FIG. 4 illustrates the potential level on the essential control lines. The discharging circuit 55 is assumed to halve discharged the digit lines DL0 to DLk.

The controller changes the precharging line P changes the precharge level Pch at time t10, and the precharge control line PC and the charge control line PSC to the active high level at time t11. The charging transistors T50 and T30 turn on, and the input line SIL and the section selector 53 are charged to the precharge level Pch and the positive power voltage level Vcc, respectively. The controller recovers the precharge control line PC and the precharging line P to the inactive low level at time t12, and the input line SIL is isolated from the precharging line P. Thus, the input line SIL is precharged in a precharging period between time t11 and time t12.

Subsequently, the controller changes the discharge control line SIC to the inactive low level, and the address decoder 51 changes the section/block selecting lines Y0 and BS0 and the word line W1 or W3 to the active high level and the active low level at time t13. The discharging transistor T70 turns off, and the interconnecting line MSC is electrically isolated from the ground line. The switching transistor T20 turns on so as to connect the current source 55 to the digit line DL0, and the block selector BSC01 connects the digit line DL0 to the memory block MB01. The other memory blocks MB02, MB03 and MB04 are isolated from the digit line DL0.

If the word line W1 is changed to the active low level, the enhancement type memory transistor cuts off the current path of the memory block MB01, and the current does not reach the interconnecting line MCS. Although the digit line DL0 rapidly rises as indicated by plots PL3, the interconnecting line MCS remains in the ground level, and the discharging transistor T71 is turned off. Thus, the potential transfer circuit 57 maintains the input line SIL in the precharge level Pch, and the sense amplifier 52 determines the accessed memory transistor to be enhancement type.

On the other hand, if the word line W3 is changed to the active low level, current flows therethrough. For this reason, the potential level on the digit line DL0 rises as indicated by plots PL4, and the current starts to raise the potential level on the interconnecting line MCS at time t14. The potential level on the interconnecting line MCS exceeds the threshold of the discharging transistor T71 at time t15, and the discharging transistor T71 turns on at time t15 so as to discharge the input line SIL. For this reason, the potential level on the input line SIL starts to decay at time t15, and reaches the ground level at time t16. The precharge level Pch is close to the threshold of the sense amplifier 52, and the input line SIL immediately decays under the threshold of the sense amplifier 52. The sense amplifier 52 determines the accessed memory transistor to be depletion type.

The input line SIL is electrically isolated from the digit lines DL0 to DLk, the section selector 53, the block selectors BSC01 to BSCk2 and the memory blocks MB01 to MBk4, and the parasitic capacitance coupled to the input line SIL is much smaller than that of the prior art sense amplifier 30. Moreover, the current is supplied from the positive potential line Vcc through the selected memory block to the interconnecting line MCS, and the input line SIL is changed to the precharge level Pch close to the threshold of tile sense amplifier 52. For this reason the time period ty between time t13 and time t16 is much shorter than the time period tx, and the semiconductor read only memory device according to the present invention achieves an advantage in that access time is shortened.

The controller changes the charge control line PSC and the discharge control line SIC to the inactive low level and the active high level, respectively at time t17 and the address decoder 51 concurrently recovers the section/block selecting line Y0 and BS0 and the word line W1/W3 to the inactive low level and the inactive high level. The charging transistor T30 turns off so as to isolate the section selector 53 from the positive power voltage line Vcc, and the discharging transistor T70 turns on so as to discharge the interconnecting line MCS. Thus, data read-out is carried out in the read-out period between time t13 and time t17.

The controller changes the discharge control line DC to the active high level at time t18, and the discharge transistors T40 to T4k turn on so as to discharge the all of the digit lines DL0 to DLk. The discharge control line DC is recovered to the inactive low level at time t19, and the semiconductor read only memory device enters into ready-for-access state.

Another attractive feature of the semiconductor read only memory device is that the current source 55 is separated from the sense amplifier 52. The Current source 55 is designed independently on the sense amplifier 52. The charging transistor T30 is designed to have the current driving capability as large as possible without any undesirable influence on the sense amplifier 52. This results in acceleration of data read-out. Moreover, the current source 55 with a large current driving capability can supply current through a large number of memory transistors to the interconnecting line MCS, thus and the designer can increase the memory transistors of each memory block.

The second additional attractive feature of the semiconductor read only memory device is a simple circuit configuration of the sense amplifier 52. The sense amplifier 52 is designed to discriminate the potential level on the input line SIL, and has a simple circuit configuration. The sense amplifier 52 occupies a small area, and rapidly determines the operation mode of the accessed memory transistor. The simple circuit configuration allows a designer to easily cope with undesirable noise.

The third additional attractive feature of the semiconductor read only memory device is that only the input line SIL is connected to the input node of the sense amplifier 52. This means that the potential level on the input line SIL is changed by the read-out data bit only . Only the input line SIL is connected to the sense amplifier 52, and the potential level at the sense amplifier 52 is less liable to fluctuate. This results in the short time period ty. Moreover, it is easy to space the input line SIL from other signal lines, and the input line SIL is less liable to be affected by noise.

Second Embodiment

Figure 5:
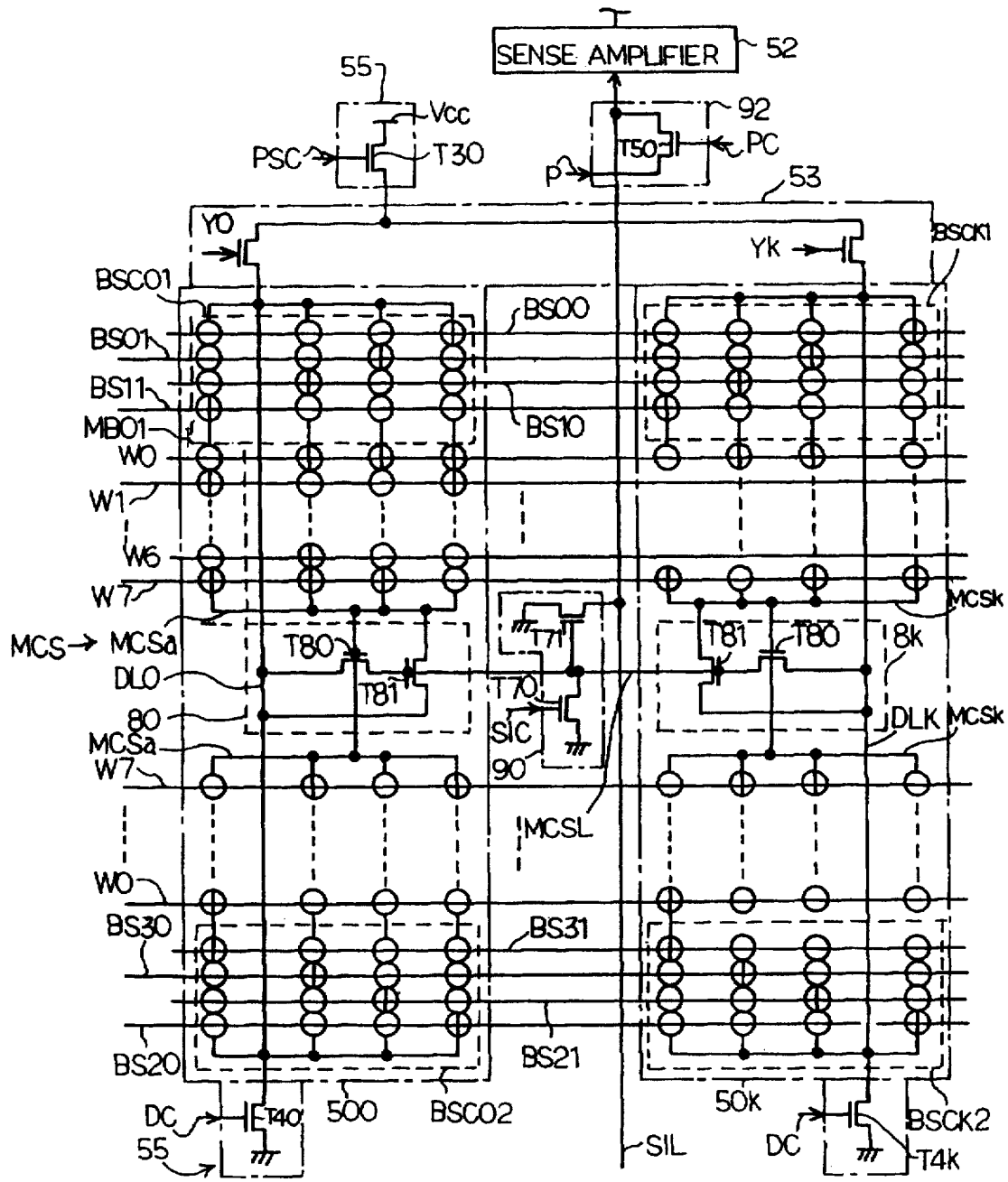
FIG. 5 is a circuit diagram showing the arrangement of another semiconductor read only memory device according to the present invention.

FIG. 5 illustrates another semiconductor read only memory, device embodying the present invention. In the first embodiment, if the memory sections 500 to 50k are increased, the interconnecting line MCS is elongated, and a large amount of parasitic capacitance is coupled thereto. This results in current source 55 requiring a long time for charging the interconnecting line MCS. The semiconductor read only memory device shown in FIG. 5 has an interconnecting line MCS divided into section lines MCSa to MCSk respectively assigned to the memory sections 500 to 50k, and the potential level on each section line MCSa to MCSk is transferred through a common line MCSL to the input line SIL. References used for the first embodiment designate components of the second embodiment corresponding to those of the first embodiment.

In order to transfer the potential level on the selected section line to the input line SIL, the semiconductor read only memory device comprises a plurality of first-stage potential transferring circuits 80 to 8k for transferring the potential level on the section lines MCSa to MCSk to the common line MCSL, a second-stage potential transferring circuit 90 for transferring the potential level on the common line MCSL to the input line SIL and a precharge circuit 92 for precharging the input line SIL to the precharge level Pch. The precharge circuit 92 is similar in circuit configuration to the precharge circuit 56, and no further description is incorporated hereinbelow. Two switching transistors T80 and T81 are incorporated in each first-stage potential transferring circuit 80/ . . . /8k. The switching transistor T80 is connected between the associated digit line DL0/ . . . /DLk and the common line MCSL, and is gated by the associated section line MCSa/ . . . MCSk. On the other hand, the switching transistor T81 is connected between the associated digit line and the associated section line, and is gated by the common line MCSL. The second-stage potential transferring circuit 90 is similar in circuit configuration to the potential transferring circuit 57, and the component transistors are labeled with the same references as those of the potential transferring circuit 57 without detailed description.

Figure 6:
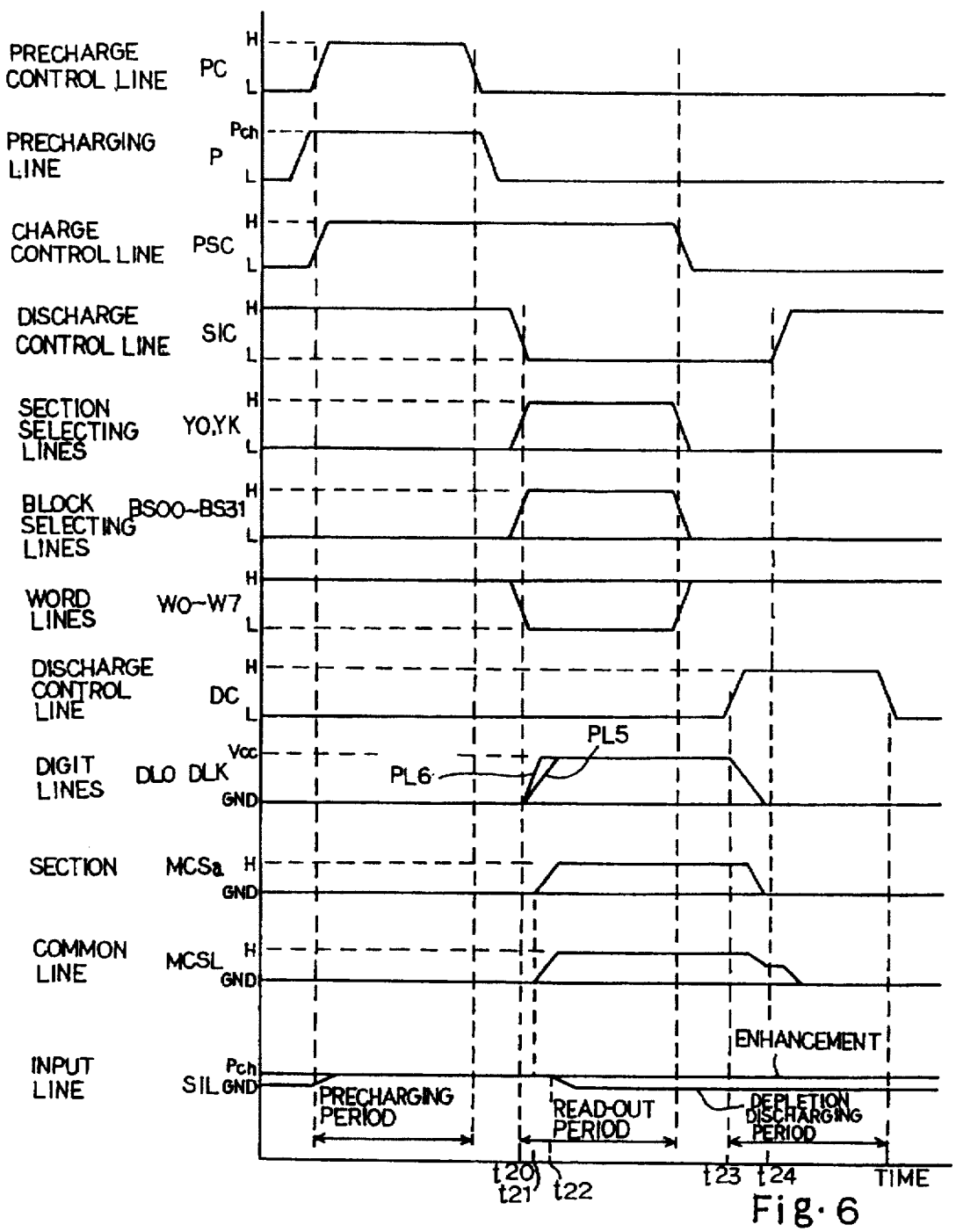
FIG. 6 is a diagram showing the potential levels on essential control lines in the semiconductor read only memory device; of FIG. 5

FIG. 6 illustrates a read-out sequence of the semiconductor read only memory device. The read-out sequence is similar to that of the first embodiment except for the circuit behavior of the first-stage potential transferring circuit 80 to 8k and the second-stage potential transferring circuit 90, and, for this reason, description is focused on them.

Assuming now that the selected memory transistor of the memory block MB01 is depletion type, current flows through the selected memory block into the associated section line MCSa, and the digit line DL0 starts to raise the potential level at time 20 as indicated by plots PL5. Accordingly, the section line MCSa starts to raise the potential level at time t21, and the switching transistor T80 turns on so as to connect the digit line DL0 to the common line MCSL. The potential level on the common line MCSL is increased together with the section line MCSa. When the common line MCSL exceeds the threshold of the switching transistor T71, the switching transistor T71 turns on, and starts to discharge the input line SIL at time t22. The sense amplifier 52 monitors the variation of potential level on the input line SIL or the current discharged from the input line SIL, and determines the accessed memory transistor to be depletion type.

On the other hand, if the selected memory transistor is enhancement type, the digit line DL0 raises the potential level as indicated by plots PL6; however, the section line MCSa and the common line MCSL remain in the ground level. For this reason, the switching transistor T71 is turned off, and the input line SIL remains precharged. The sense amplifier 52 determines the accessed memory transistor to be enhancement type.

The discharging period is described on the assumption that depletion type memory transistor has been accessed. After the discrimination of the operation mode, the controller changes the discharge control signal DC to the active high level at time t23, and the digit lines DL0 to DLk are discharged to the ground line. Then, the potential level on the common line MCSL causes the switching transistor T81 to turn on, and the section line MCSa is discharged. While the section line MCSa is higher in potential level than the digit line DL0 by the threshold of the switching transistor T80, the common line MCSL is discharged through the switching transistor T80. The current driving capability of the switching transistor T80 and the current driving capability of the switching transistor T81 are appropriately designed so as to discharge the common line MCSL as much as possible. The controller changes the discharge control line SIC to the active high level at time t24, and the residual electric charge is discharged from the common line MCSL to the ground line.

Thus, the section lines MCSa to MCSk accelerate the data read-out, and allow the manufacturer to increase the memory blocks connected to each digit line.

Figure 7:
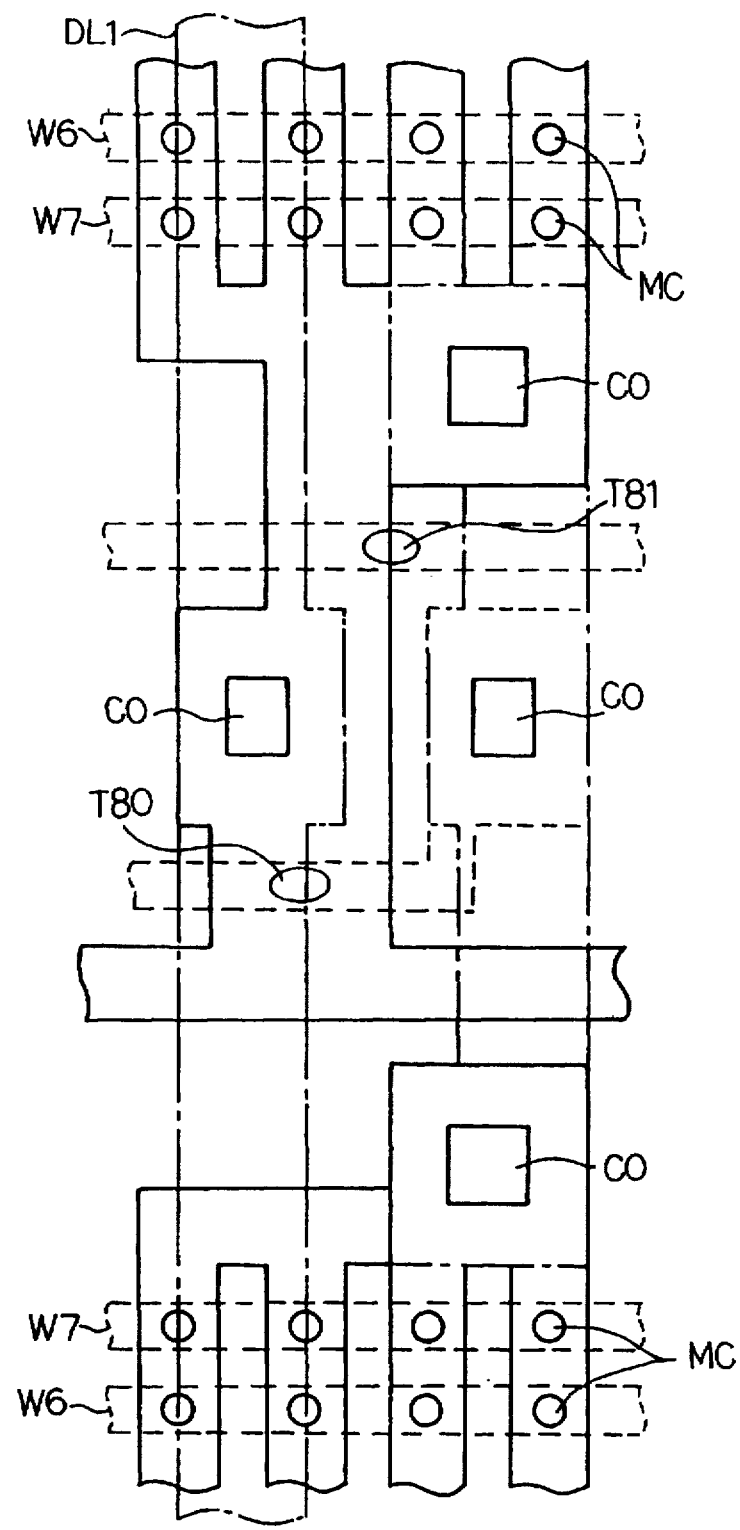
FIG. 7 is a plan view showing the layout of a potential transferring circuit incorporated in the semiconductor read only memory device of the present invention.

FIG. 7 illustrates the layout around the area assigned to the first-stage potential transferring circuit 80/ . . . /8k. Real lines, broken lines and lot-and-dash lines are representative of impurity regions, polysilicon strips for the word lines and so on and metal strips for the digit lines and so on. The switching transistors T80 and T81 and the memory transistors MC are formed in the areas where the polysilicon strips intersects the impurity regions. Contact holes are labeled with "CO". In this layout, the four memory blocks of each memory section are arranged in parallel, and the relatively wide area for the first-stage potential transferring circuit 80/ . . . /8k takes place between the set of the four memory blocks and another set of the four memory blocks.

As will be appreciated from the foregoing description, the potential transferring circuit 57 or circuits 80 to 8k and 90 rapidly change the potential level on the input line SIL, and the sense amplifier 52 quickly determines the operation mode of the accessed memory transistor. The precharge circuit 92 charges only the input line SIL, and the current consumption is smaller than that of the prior art semiconductor memory device with the digit lines precharged before the selection of the memory transistor.

Although particular embodiments of the present invention have been shown and described, it will be obvious to those skilled in the art that various changes and modifications may be made without departing from the spirit and scope of the present invention.

For example, the current source and the potential transferring circuit may be incorporated in an electrically programmable read only memory device or an electrically erasable and programmable read only memory device. The semiconductor non-volatile memory device may form a part of a large scale integration together with other function blocks.

More than one sense amplifier may be incorporated in a semiconductor non-volatile memory device so as to concurrently read out more than one data bit.

What is claimed is:

1. A semiconductor non-volatile memory device comprising:

a plurality of memory cells having respective first nodes connectable to a common node, and respectively storing data bits;

a plurality of digit lines selectively connectable to second nodes of said plurality of memory cells;

a plurality of word lines selectively connected to said plurality of memory cells, and selectively changed to an active level so as to select one of said plurality of memory cells;

a current source for supplying current to the second node of said one of said plurality of memory cells;

a sense amplifier for checking a potential level at said common node to determine whether said one of said plurality of memory cells provides a current path to said common node for determining the logic level of one of said data bits stored therein;

a selector connected between said plurality of memory cells, said plurality of digit lines and said current source so as to connect said current source to said one of said plurality of memory cells; and a potential transferring circuit for transferring said potential level at said common node from said common node to said sense amplifier.

2. The semiconductor non-volatile memory device as set forth in claim 1, in which said potential transferring circuit includes an input line connected to an input node of said sense amplifier, a precharging circuit connected between a precharging line and said input line and responsive to a first control signal so as to charge said input line to a precharge level in a first phase before said sense amplifier determines the logic level of said one of said data bits stored in said one of said plurality of memory cells, and a transfer circuit connected between said input line, said common node and a constant potential source and operative to connect said input line to or disconnect said input line from said constant potential source depending upon said potential level at said common node in a second phase between said first phase and the determination of said logic level of said one of said data bits and to connect said common node to said constant potential source in a third phase after said determination of said logic level.

3. The semiconductor non-volatile memory device as set forth in claim 2, in which said precharging circuit is implemented by a transistor responsive to said first control signal in said first phase for providing a current path between said precharging line and said input line.

4. The semiconductor non-volatile memory device as set forth in claim 2, in which said transfer circuit includes a first transistor connected between said input line and said constant potential source and changed between off-state and on-state depending upon said potential level at said common node in said second phase, and a second transistor connected between said common node and said constant potential source and responsive to a second control signal for providing a current path between said common node and said constant potential source in said third phase.

5. The semiconductor non-volatile memory device as set forth in claim 2, in which said precharge level is close to a threshold of said sense amplifier for discriminating said logic level.

6. The semiconductor non-volatile memory device in claim 1, in which said plurality of memory cells are divided into a plurality of memory sections associated with common sub-nodes electrically isolated from one another and respectively connected to first nodes of said plurality of memory sections, and said potential transferring circuit includes an input line connected to an input node of said sense amplifier, a precharge circuit connected between a precharging line and said input line for charging said input line to a precharge level in a first phase before the determination of said logic level of said one of said data bits, a plurality of first-stage transfer circuits each connected between one of said common sub-nodes, one of said plurality of digit lines and a shared line, transferring the potential level of said one of said common sub-nodes to said shared line in a second phase between said first phase and said determination of said logic level and providing a current path from said shared line and said one of said common sub-nodes to said one of said plurality of digit lines for partially discharging said shared line to said one of said plurality of digit lines in a third phase after said determination of said logic level, a second-stage transfer circuit connected between said shared line, said input line and a constant potential source, transferring the potential level on said shared line to said input line in a fourth phase between said second phase and said determination of said logic level and connecting said shared line to said constant potential source in said third phase.

7. The semiconductor non-volatile memory device as set forth in claim 6, in which said precharge circuit is implemented by a transistor connected between said precharging line and said input line and responsive to a control signal so as to turn on or turn off depending upon the potential level on said shared line in said first phase.

8. The semiconductor non-volatile memory device as set forth in claim 6, in which said precharge level is close to a threshold of said sense amplifier for discriminating said logic level.

9. The semiconductor non-volatile memory device as set forth in claim 6, in which each of said plurality of first-stage transfer circuits includes a first transistor connected between said one of said plurality of digit lines and said shared line, responsive to said potential level on said one of said common sub-nodes for connecting said one of said plurality of digit lines to or disconnecting said one of said plurality of digit lines from said shared line in said second phase and in a first period of said third phase, and a second transistor connected between said one of said common sub-nodes and said one of said plurality of digit lines and responsive to said potential level on said shared line so as to discharge said one of said common sub-nodes to said one of said plurality, of digit lines in said first period of said third phase.

10. The semiconductor non-volatile memory device as set forth in claim 9, in which said second-stage transfer circuit includes a third transistor connected between said input line and said constant potential source and responsive to said potential level on said shared line for connecting said input line to or disconnecting said input line from said constant potential source in said fourth phase, and a fourth transistor connected between said shared line and said constant potential source and responsive to a control signal for discharging said shared line in a second period of said third phase after said first period.

* * * * *